United States Patent [19]
Woditsch et al.

[11] Patent Number: 6,013,872
[45] Date of Patent: Jan. 11, 2000

[54] DIRECTIONALLY SOLIDIFIED, MULTICRYSTALLINE SILICON, A PROCESS FOR THE PRODUCTION THEREOF AND ITS USE, AND SOLAR CELLS CONTAINING THIS SILICON AND A PROCESS FOR THE PRODUCTION THEREOF

[75] Inventors: Peter Woditsch; Christian Hässler, both of Krefeld; Wolfgang Krumbe, Leichlingen; Horst Lange, Bochum; Klaus Weber, Freiberg, all of Germany

[73] Assignee: Bayer AG, Leverkusen, Germany

[21] Appl. No.: 09/061,855

[22] Filed: Apr. 17, 1998

[30] Foreign Application Priority Data

Apr. 25, 1997 [DE] Germany ............... 197 17 428
Mar. 9, 1998 [DE] Germany ............... 198 10 019

[51] Int. Cl.$^7$ ............................................. H01L 25/00
[52] U.S. Cl. ............... 136/255; 136/258; 136/261; 423/348; 423/349; 423/350; 423/325
[58] Field of Search ............... 136/255, 258, 136/261; 423/348, 349, 350, 325

[56] References Cited

U.S. PATENT DOCUMENTS

| | | | |
|---|---|---|---|
| 3,790,829 | 2/1974 | Roth | 310/4 |
| 4,200,472 | 4/1980 | Chappell et al. | 136/246 |
| 4,300,989 | 11/1981 | Chang et al. | 204/164 |
| 4,523,966 | 6/1985 | Tsuya et al. | 136/258 |
| 4,631,352 | 12/1986 | Daud et al. | 136/249 |
| 4,927,489 | 5/1990 | Campbell et al. | 136/261 |
| 5,415,700 | 5/1995 | Arthur et al. | 136/259 |
| 5,866,471 | 2/1999 | Beppu et al. | 136/258 |

*Primary Examiner*—Mark Chapman
*Attorney, Agent, or Firm*—Connolly Bove Lodge & Hutz LLP

[57] ABSTRACT

The present invention relates to directionally solidified, arsenic- and/or antimony-containing, multicrystalline silicon, a process for the production thereof and its use, and to solar cells containing this silicon and a process for the production thereof.

14 Claims, 1 Drawing Sheet

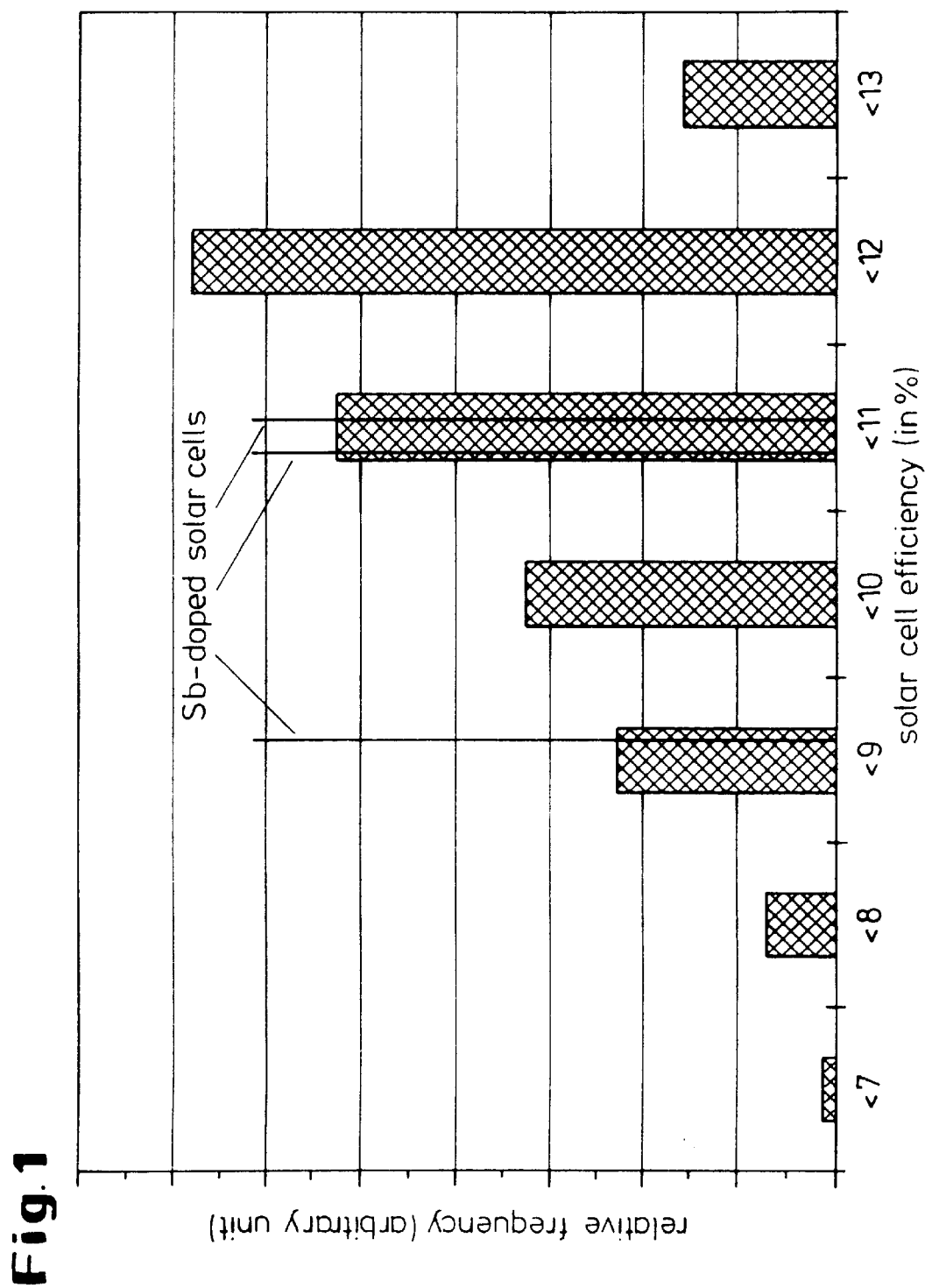

DIRECTIONALLY SOLIDIFIED, MULTICRYSTALLINE SILICON, A PROCESS FOR THE PRODUCTION THEREOF AND ITS USE, AND SOLAR CELLS CONTAINING THIS SILICON AND A PROCESS FOR THE PRODUCTION THEREOF

The present invention relates to directionally solidified, arsenic- and/or antimony-containing, multicrystalline silicon, a process for the production thereof and its use, and to solar cells containing this silicon and a process for the production thereof.

Silicon wafers for processing into solar cells are usually made from high-purity silicon which, after melting, is converted into large-format blocks or bars by directional crystallization, e.g. by the SOPLIN (Solidification by Planar Interface) method. After dividing into columns with different cross-sectional areas, the block material is cut up into wafers about 200–400 μm thick using inner-diameter saws or multiple wire saws. The multicrystalline silicon wafers thus obtained may then be processed into solar cells.

Very high standards are set for the starting material used in terms of its chemical purity, since metallic and non-metallic impurities and inclusions of electrically active particles such as SiC can have a negative effect on the resistivity, the polarity of conductivity of the silicon and the lifetime of the charge carriers or the diffusion lengths of the minority carriers, thus impairing the efficiency of the solar cell.

For the production of multicrystalline silicon wafers for photovoltaic use it has so far been necessary to use high-purity silicon obtained by the decomposition of high-purity, volatile silanes such as $SiH_4$ or $SiHCl_3$, the purity level of which allows economical processing into large-scale and very large-scale integrated circuits for computer technology. Only impurity atoms which are unavoidable due to the type of process employed, such as oxygen, which is introduced for example from the quartz crucible used for melting the silicon, or carbon from graphite components in the interior of the crystallisation unit, are therefore present in relatively high concentrations of up to $10^{18}$ atoms/cm$^3$. All other impurities, except for the deliberately added main dopant (which is almost always boron in a range of $10^{16}$ atoms/cm$^3$) are present in a concentration range of $10^{13}$ atoms/cm$^3$ or even less (in particular in the case of metallic impurities). Only the following sources of raw materials are therefore suitable: high-purity silicon grades which come directly from silane decomposition and silicon grades which are formed during the processing of high-purity, pyrolytically deposited silicon to monocrystals by the Czochralski or float-zone method.

The present requirement of using silicon with a high general level of chemical purity for processing into solar cells necessitates the use of very expensive grades of raw materials, however, and at the same time narrows the usable material base for the broad, inexpensive development of photovoltaics.

The object of the invention was therefore to provide directionally solidified, multicrystalline silicon that may be used with a high degree of efficiency, especially in solar cells, and can be produced inexpensively.

Surprisingly, it has now been found that directionally solidified, multicrystalline silicon with a defined antimony and/or arsenic content meets this set of requirements.

The invention therefore relates to directionally solidified, multicrystalline silicon with an arsenic and/or antimony content in the range of $10^{13}$–$10^{17}$ atoms/cm$^3$.

In another embodiment of the invention the silicon contains As and Sb in a range of $10^{13}$ to $10^{17}$ atoms/cm$^3$ in addition to the main dopant consisting of at least one element of the 3rd main group (such as for example B and Al) and/or at least one element of the 5th main group (such as for example P, but not As and Sb) in a concentration of $10^{15}$ to $10^{19}$ atoms/cm$^3$.

In a preferred embodiment of the invention, the silicon according to the invention has an antimony content in the range of $10^{15}$–$10^{16}$ atoms/cm$^3$.

In another preferred embodiment of the invention, the silicon according to the invention has an oxygen content in the range of $10^{16}$–$2\times10^{18}$ atoms/cm$^3$.

The silicon according to the invention is preferably distinguished by a specific electrical resistivity in the range of between 100 and 10,000 mΩcm.

In another preferred embodiment of the invention, the diffusion length $L_D$ of the minority carriers in the silicon according to the invention is at least 10 μm.

The diffusion path $L_D$ is defined by the formula below, in which $$L_D = \sqrt{D\tau}$$

with D=diffusion coefficient and τ=lifetime. D is a material constant which is laid down in S.M. Sze: "Physics of Semiconductor Devices", John Wiley & Sons, New York, 1981, pages 29–30. The lifetime τ is preferably measured by the microwave reflection technique in a Semilab WT 85 from Semilab on the surface, passivated with a 2% iodine-ethanol solution, of a silicon wafer about 300 μm thick consisting of the silicon according to the invention. Before the surface passivation with iodine (2%)/ethanol, the silicon wafer is preferably treated with a phosphoric acid (80%)/nitric acid (65%)/hydrofluoric acid (40%) etching solution in a ratio of components of 3:3:1 for at least 2 minutes (corresponding to at least 25 μm per side removed by etching), and then immersed in 40% hydrofluoric acid for a few seconds. However, the lifetime may also be measured with other equipment, e.g. from Phoenicon.

The present invention also relates to a process for the production of the silicon according to the invention in which arsenic- and/or antimony-containing, monocrystalline or multi-crystalline silicon with an arsenic and/or antimony content in the range of $10^{13}$–$10^{17}$ atoms/cm$^3$ is melted and directionally crystallized.

Preferably, monocrystalline silicon containing $10^{13}$–$10^{17}$ atoms/cm$^3$ arsenic and/or antimony is melted and the melt is directionally crystallized into large-format blocks or bars either directly in the crucible or after pouring out into moulds, e.g. by the SOPLIN method. The multicrystalline silicon blocks are then preformatted by coarse division in a manner which is familiar to the person skilled in the art, and then sawn up into silicon wafers by wire or inner-diameter saws.

In another preferred embodiment of the invention, arsenic- and/or antimony-containing, monocrystalline silicon with an arsenic and/or antimony content >$10^{17}$ atoms/cm$^3$ is used. This is melted, the arsenic or antimony contents are reduced to $\leq 10^{17}$ atoms/cm$^3$ at a pressure of $10^{-4}$–$10^{-5}$ mbar by blowing through reactive gases such as $H_2$, $H_2O$, $SiCl_4$ or HCl, by slag extraction and/or liquation and it is then directionally crystallized.

In a preferred embodiment of the invention a main dopant consisting of at least one element of the 3rd or 5th main group, such as for example B or P, is either contained in the starting material or is added to the melt.

The invention also relates to the use of the multicrystalline silicon according to the invention for solar cells.

The invention further relates to solar cells containing the silicon according to the invention.

The term "solar cells" within the meaning of the invention includes those with p-n junctions, with metal insulator semiconductor junctions or metal semiconductor junctions. The solar cells according to the invention may contain either at least 1 element from the 3rd and at least one element from the 5th main group, such as P, B, Al, Ga and/or In or an epitaxial layer which forms the p-n junctions.

The elements from the 3rd and 5th main groups are present in quantities of preferably $10^{15}$ to $10^{19}$ atoms/cm$^3$.

The solar cells according to the invention may be produced e.g. by the process described in Sonnenenergie: Photovoltaik, p. 148 to 169, Teubner Verlag 1994, silicon with the As and/or Sb contents according to the invention being used or the appropriate contents being added to the silicon.

The invention further relates to a process for the production of solar cells according to which a silicon wafer of the multicrystalline silicon according to the invention is doped with at least one p-type conductor such as e.g. preferably B, and then provided with an n-type layer, or doped with at least one n-type conductor and then provided with a p-type layer.

In a preferred embodiment, a p-type (e.g. boron-doped) arsenic- and/or antimony-containing silicon wafer is provided with an n-type layer, the so-called emitter, by diffusion of phosphorus in a resistance-heated quartz tube furnace. The diffusion of phosphorus preferably takes place from the gas phase using e.g. POCl$_3$. The temperatures during phosphorus diffusion are preferably within the range of between 700° C. and 1200° C., particularly preferably between 800° C. and 950° C. The duration of the diffusion is preferably about 1 h at low temperatures of e.g. 800° C. and only a few minutes at higher temperatures (950° C.). In the same way, an n-type arsenic- and/or antimony-containing silicon wafer may be provided with a thin, near-surface p-type emitter, and thus a p-n junction, by the diffusion of an element producing p-type doping, preferably boron. The diffusion again takes place preferably from the gas phase, e.g. using BBr$_3$. Temperatures and times for boron diffusion essentially correspond to those for phosphorus diffusion.

The p-n junction of the solar cell may also be made by applying one or more p- or n-type layers (between 1 and 100 μm thick) by means of gas-phase or liquid-phase epitaxy on the p- or n-type arsenic- and/or antimony-containing silicon wafer.

After production of the p-n junction, the thin upper n- or p-type layer produced by diffusion is provided with a front contact, preferably vapour-deposited through a mask, which is designed in a grid-type structure and has a surface coverage of about 10%. Metals which allow a particularly low-resistivity junction with the diffused layer, such as e.g. titanium or aluminium, are preferably used for this front contact. If for example, phosphorous was diffused (n-type emitter), titanium which may be reinforced by one or more additional metal layers up to a total thickness of several μm is preferably used. The back of the silicon wafer is coated with vapour-deposited metal over its entire surface or is provided with a grid-type contact like the front. Aluminium is preferably used here, which may again be reinforced up to a thickness of several μm by additional metal layers.

Finally, the solar cell may be provided with an antireflection layer on the emitter side which reduces the proportion of sunlight reflected by the solar cell. This involves applying one or more transparent layers with refractive indices between those of silicon and air in layer thicknesses which result in one or more reflection minima of the thin layer in the visible or infrared range of the spectrum. TiO$_2$ with a layer thickness of about 0.1 μm is preferably used to produce the antireflection layer.

The following examples illustrate the invention without representing any limitation thereof.

EXAMPLES

Example 1

A block of multicrystalline silicon with an average antimony content of $10^{15}$ atoms/cm$^3$ was produced by melting an antimony-containing raw material in a quartz crucible and pouring the antimony-containing melt into a (Si$_3$N$_4$) mould, followed by directional solidification by the SOPLIN process. In addition to the abovementioned antimony content the p-conducting block contained a main boron dopant in a range of approx. $5\times10^{16}$ atoms/cm$^3$. Following directional solidification the multicrystalline silicon blocks were preformatted by coarse subdivision and finally sawn into individual wafers using an inner-diameter saw.

In order to determine the photovoltaic quality of the antimony-containing multicrystalline silicon, solar cells (of a format of 5×5 cm$^2$) were then processed from three different regions (the bottom, middle and top) of the antimony-containing block. The production of the p-n junction of the solar cell was carried out in a resistance-heated tube furnace by phosphorus diffusion from the gas phase (POCl$_3$) in a quartz tube at 820° C for one hour. After etching off the phosphorus-containing glass a four-layered reverse side contact (Al/Ti/Pd/Ag) was applied by vapour deposition onto one side of the wafer in a high-vacuum apparatus and then sintered at 620° C. for 30 minutes under a nitrogen atmosphere. Finally a grid structure (surface coverage: approx. 10%) was applied to the front side in the form of a three-layer system (Ti/Pd/Ag), also by high-vacuum vapour deposition.

Comparative Example

For the comparative example high-purity multicrystalline silicon which had a content of impurities (except C, N, O) of $<5\times10^{13}$ atoms/cm$^3$ and was doped with $5\times10^{16}$ atoms/cm$^3$ was used. The same procedure as in Example 1 was used for determining the photovoltaic properties.

FIG. 1 shows the solar cell efficiency of the three antimony-containing solar cells measured at 25° C. and a light intensity of approx. 100 mW/cm$^2$, compared with the efficiency distribution (block diagram) using high-purity, non-antimony-containing silicon. A factor of 1.45 was estimated for the antireflection layer not applied for the sake of simplicity in all of the solar cells. The conditions during the crystallisation of the multicrystalline blocks and the production of solar cells were identical for the antimony-containing and the high-purity starting materials (comparative example). All three antimony-containing solar cells lie clearly within the efficiency distribution range obtained when using a high-purity starting material in the same cell production process. Thus, silicon containing antimony in addition to the main boron dopant can be used for the production of multicrystalline solar cells virtually without any loss of efficiency.

We claim:

1. Directionally solidified, multicrystalline block silicon having an arsenic content, antimony content, or an arsenic and antimony content, in the range of $10^{13}$–$10^{17}$ atoms/cm$^3$ produced by melting and directionally crystallizing arsenic and/or antimony-containing silicon.

2. Directionally solidified, multicrystalline silicon according to claim 1, having an oxygen content in the range of between $10^{16}$ and $2\times10^{18}$ atoms/cm$^3$.

3. Directionally solidified, multicrystalline silicon according to claim 2, wherein the resistivity is in the range of between 100 and 10,000 mΩcm.

4. A solar cell prepared from a wafer of the directionally solidified, multicrystalline silicon according to claim 3.

5. Directionally solidified, multicrystalline silicon according to claim 2, wherein the diffusion length $L_D$ of the minority carriers is at least 10 μm.

6. A solar cell prepared from a wafer of the directionally solidified, multicrystalline silicon according to claim 2.

7. Directionally solidified, multicrystalline silicon according to claim 1, wherein the resistivity is in the range of between 100 and 10,000 mΩcm.

8. Directionally solidified, multicrystalline silicon according to claim 3, wherein the diffusion length $L_D$ of the minority carriers is at least 10 μm.

9. A solar cell prepared from a wafer of the directionally solidified, multicrystalline silicon according to claim 7.

10. Directionally solidified, multicrystalline silicon according to claim 1, wherein the diffusion length $L_D$ of the minority carriers is at least 10 μm.

11. A solar cell prepared from a wafer of the directionally solidified, multicrystalline silicon according to claim 7.

12. A solar cell prepared from a wafer of the directionally solidified, multicrystalline silicon according to claim 1.

13. A process for producing the solar cell according to claim 12, wherein a silicon wafer of multicrystalline silicon is doped with at least one p-type conductor and then provided with an n-type layer, or doped with at least one n-type conductor and then provided with a p-type layer.

14. Directionally solidified, multicrystalline silicon according to claim 1, further comprising a main dopant consisting of at least one element of the $3^{rd}$ or $5^{th}$ main group.

* * * * *